United States Patent
Isberg

(10) Patent No.: US 9,048,978 B2
(45) Date of Patent: Jun. 2, 2015

(54) CLOCKING SCHEME FOR A WIRELESS COMMUNICATION DEVICE

(75) Inventor: Martin Isberg, Lund (SE)

(73) Assignee: TELEFONAKTIEBOLAGET L M ERISSON (PUBL), Stockholm (SE)

(*) Notice: Subject to any disclaimer, the term of this patent is extended or adjusted under 35 U.S.C. 154(b) by 109 days.

(21) Appl. No.: 13/809,234

(22) PCT Filed: Jul. 5, 2011

(86) PCT No.: PCT/EP2011/061301
§ 371 (c)(1),
(2), (4) Date: Feb. 12, 2013

(87) PCT Pub. No.: WO2012/007317
PCT Pub. Date: Jan. 19, 2012

(65) Prior Publication Data
US 2013/0208839 A1  Aug. 15, 2013

Related U.S. Application Data

(60) Provisional application No. 61/376,380, filed on Aug. 24, 2010.

(30) Foreign Application Priority Data

Jul. 14, 2010 (EP) .................................... 10169482

(51) Int. Cl.
*H04L 7/00* (2006.01)
*H03J 7/06* (2006.01)

(52) U.S. Cl.
CPC .............. *H04L 7/0016* (2013.01); *H03J 7/065* (2013.01)

(58) Field of Classification Search
CPC .......... H04L 2027/0067; H04B 15/04; H04B 2215/064; H03L 2207/50; H03L 7/1806; H03L 7/06

USPC ................ 375/219, 226, 316, 324, 327, 371, 375/373–376; 455/114.1, 114.2, 296, 317
See application file for complete search history.

(56) References Cited

U.S. PATENT DOCUMENTS 4,484,221 A   11/1984  Tults
5,440,259 A    8/1995  Yokomura
(Continued)

FOREIGN PATENT DOCUMENTS

EP    2 202 899 A1   6/2010
RU    2178894 C1    1/2002
(Continued)

OTHER PUBLICATIONS

International Search Report issued in corresponding International application No. PCT/EP2011/061301, date of mailing Oct. 21, 2011.
(Continued)

*Primary Examiner* — Khanh C Tran
(74) *Attorney, Agent, or Firm* — Patent Portfolio Builders PLLC

(57) ABSTRACT

The invention relates to a method and a system for generating clock signals in a wireless communication device. The method includes generating an uncorrected reference clock signal, generating at least one frequency correction value corresponding to a frequency error in the uncorrected reference clock signal, and generating at least one radio frequency clock signal based on the uncorrected clock signal and the at least one frequency correction value, for receiving and transmitting radio frequency signals. The method further comprise generating, independently of the at least one radio frequency clock signal, a baseband timing signal based on the uncorrected reference clock signal and the at least one frequency correction value, for clocking base-band signal processing circuits.

16 Claims, 7 Drawing Sheets

(56) References Cited

U.S. PATENT DOCUMENTS

| | | | |
|---|---|---|---|
| 5,812,940 A * | 9/1998 | Lindell | 455/114.1 |
| 6,205,183 B1 * | 3/2001 | Dent | 375/261 |
| 7,103,342 B2 * | 9/2006 | Kusbel et al. | 455/296 |
| 7,181,239 B2 * | 2/2007 | Yamamoto et al. | 455/556.1 |
| 7,626,462 B1 | 12/2009 | Hietala et al. | |
| 2009/0088085 A1 * | 4/2009 | Nilsson et al. | 455/76 |

FOREIGN PATENT DOCUMENTS

| | | |
|---|---|---|
| RU | 2249919 C2 | 4/2005 |
| RU | 2286015 C1 | 10/2006 |
| WO | 2008/021810 A2 | 2/2008 |

OTHER PUBLICATIONS

Written Opinion of the International Searching Authority issued in corresponding International application No. PCT/EP2011/061301, date of mailing Oct. 21, 2011.

Written Opinion of the International Preliminary Examining Authority issued in corresponding International application No. PCT/EP2011/061301, date of mailing Aug. 1, 2012.

International Preliminary Report on Patentability issued in corresponding International application No. PCT/EP2011/061301, completion date Oct. 18, 2012.

Decision on Grant dated Feb. 10, 2015 issued in related RU Application No. 2013106282/08.

* cited by examiner

CLOCKING SCHEME FOR A WIRELESS COMMUNICATION DEVICE

TECHNICAL FIELD

The present invention relates in general to the field of communications, and more particularly, to a method and a system for generating and distributing clock signals in a wireless communication device.

BACKGROUND

Modern day wireless communication devices, such as mobile phones, require at least one clock operating at a stable reference frequency to function correctly. A stable reference frequency is typically obtained by using a free-running crystal oscillator as a reference clock. However, modern mobile terminals have strict frequency stability requirements which cannot be achieved using only a free-running crystal oscillator due to limiting factors such as temperature dependencies, supply voltage variations, and aging effects, which may cause frequency variations and/or frequency drift.

To achieve a more stable reference frequency an automatic frequency control (AFC) mechanism can be utilized. The AFC estimates a frequency error on the received signal in relation to the operating frequency of the mobile terminal and applies a correction to the free-running reference clock in order to synchronize the frequency of the mobile terminal to the counterpart transmitting the received signal. In this way frequency variations and frequency drift may be kept to a minimum.

The current trend in mobile communication is to increase the functionality of the mobile terminal by integrating functions such as Global Positioning System (GPS), Bluetooth communication, FM-radio, etc. into the mobile terminal. These integrated functions are often, due to cost-, design-, or other aspects, clocked by the same AFC corrected reference clock as the mobile terminal transceiver. However, sharing an AFC corrected reference clock may cause problems.

The frequency changes that occur when an AFC correction is applied to the reference clock will be passed on to all circuits sharing the same reference clock. These changes, even if they are relatively small, may disrupt or degrade the performance of some of the functions that require a continuous and stable reference clock. Thus, there is a need for improving the method for generating and distributing reference clock signals in a modern mobile terminal.

SUMMARY

With the above and following description in mind, it is an object of the present invention to provide a method and a system for generating and distributing clock signals in a wireless communication device that mitigates, alleviates, or eliminates one or more of the above-identified deficiencies in the art and disadvantages singly or in any combination.

According to the present invention the object is achieved in a method for generating clock signals in a wireless communication device comprising generating uncorrected reference clock signal, generating at least one frequency correction value corresponding to a frequency error in said uncorrected reference clock signal, distributing the uncorrected reference clock signal to system parts of the wireless communication device, distributing the at least one frequency correction value to at least parts having a need to produce a clocking signal with improved accuracy compared to the uncorrected reference clock signal, and producing a clocking signal based on said uncorrected clock signal and said at least one frequency correction value in parts having a need to produce a clocking signal with improved accuracy compared to the uncorrected reference clock signal and producing a clocking signal based on only said uncorrected clock in parts having no need to produce a clocking signal with improved accuracy compared to the uncorrected reference clock signal.

The generating of at least one radio frequency clock signal based on said uncorrected clock signal and said at least one frequency correction value, may be for receiving and transmitting radio frequency signals, and the method may further comprise generating, independently of said at least one radio frequency clock signal, a baseband timing signal based on said uncorrected reference clock signal and said at least one frequency correction value, for clocking baseband signal processing circuits.

The method may further comprise using a timing generator circuit for generating said baseband timing signal.

The method wherein generating said baseband timing signal comprises using a phase-locked loop circuit for generating a phase-locked loop signal based on said uncorrected reference clock signal and said at least one frequency correction value, and using a timing generator circuit for generating said baseband timing signal based on said phase-locked loop signal.

The method may further comprise applying said at least one frequency correction value to sampling rate converters.

The method may further comprise applying said at least one radio frequency clock signal to radio frequency mixers and to converter circuits.

The present invention also relates to a system for generating clock signals in a wireless communication device comprising a free-running reference clock circuit adapted to generate an uncorrected reference clock signal, an frequency control circuit adapted to generate at least one frequency correction value computed to compensate for a frequency error of said reference clock circuit, an output arranged to distribute the uncorrected reference clock signal to system parts of the wireless communication device;

an output arranged to distribute the at least one frequency correction value to at least parts having a need to produce a clocking signal with improved accuracy compared to the uncorrected reference clock signal, such that parts having a need to produce a clocking signal with improved accuracy compared to the uncorrected reference clock signal are enabled to produce a clocking signal based on said uncorrected clock signal and said at least one frequency correction value, and parts having no need to produce a clocking signal with improved accuracy compared to the uncorrected reference clock signal are enabled to produce a clocking signal based on only said uncorrected clock.

The circuit may further comprise a radio frequency clock circuit adapted to generate at least one radio frequency clock signal, based on said uncorrected reference clock signal and said at least one frequency correction value, wherein said at least one radio frequency clock signal is operable connected to radio frequency circuits adapted for receiving and transmitting radio frequency signals, and a baseband timing circuit adapted to generate, independently of said at least one radio frequency clock signal, a baseband timing signal, based on said uncorrected reference clock signal and said at least one frequency correction value, to baseband signal processing circuits.

The baseband timing circuit in the system may be a timing generator circuit.

The baseband timing circuit in the system may further comprise a phase-locked loop circuit adapted to generate a phase-locked loop signal based on said uncorrected reference clock signal and said at least one frequency correction value and a timing generator circuit adapted to generate said baseband timing signal based on said phase-locked loop signal.

The at least one frequency correction value in the system may further be applied to sampling rate converters.

The free-running reference clock circuit in the system may further be a crystal oscillator.

BRIEF DESCRIPTION OF THE DRAWINGS

Further objects, features, and advantages of the present invention will appear from the following detailed description of some embodiments of the invention, wherein some embodiments of the invention will be described in more detail with reference to the accompanying drawings, in which.

DETAILED DESCRIPTION

Embodiments of the present invention will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The present invention relates in general to a method and a system for generating and distributing clock signals in wireless communication devices, and particularly to generating and distributing clock signals in mobile terminals. The embodiments of the present invention disclosed herein are described using a general direct conversion transceiver architecture for wireless communications. It is important to note that the invention is not in any way limited to be used only in conjunction with the described transceiver architecture. On the contrary, the invention and the principles thereof can also be applied and used in other types of transceiver, receiver- and transmitter architectures.

Figure 1:
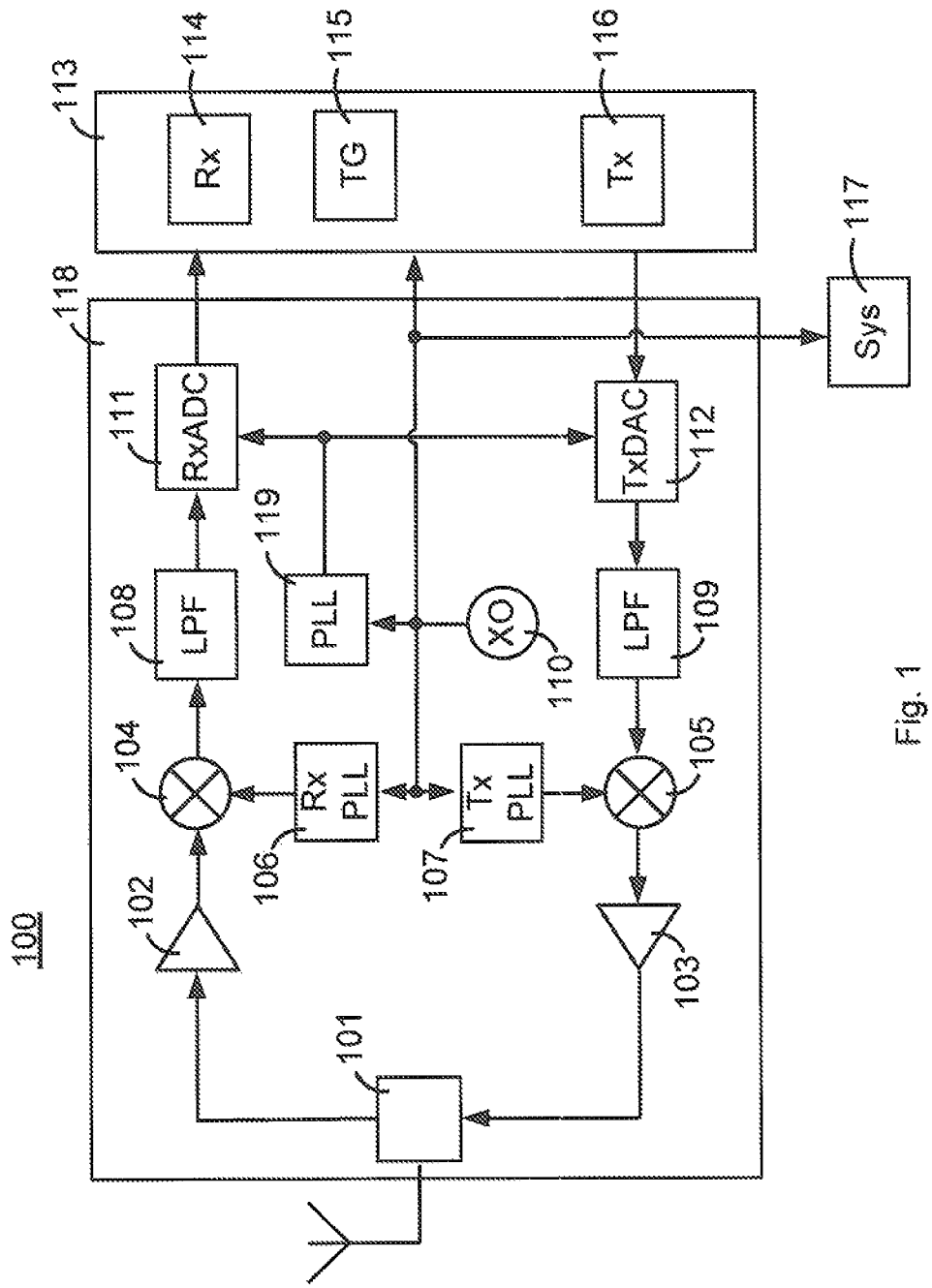
FIG. 1 shows a block diagram of a general transceiver architecture using a free-running reference clock for clocking the transceiver, according to prior art.

FIG. 1 show a block diagram of a typical transceiver architecture 100 used in wireless communication devices. The transceiver architecture 100 used in the following examples to illustrate the invention have been partitioned into three main parts, an analog radio frequency (RF) part 118, a baseband (BB) part 113, and other systems part 117. The partitioning of the transceiver architecture reflects the conventional partitioning of the integrated circuits (ICs) in the device, wherein the different parts usually are implemented in separate ICs or groups of ICs. However, the transceiver architecture 100 may in some cases be implemented in a single chip, and then the partitioned into three main parts may reflect the partitioning of the different parts (or layout) in the single chip.

The RF part 118 comprises an antenna and antenna switching means 101 for transmitting and receiving analog radio frequency signals, amplifiers 102,103 for amplifying the receive- and transmit signals, mixer 104 for down-converting the received radio frequency signal and mixer 105 for up-converting a baseband signal to a transmit radio frequency signal. The RF part 118 further comprises a set of phase locked loops to generate local oscillator signals, in this case a receive phase locked loop 106 (RxPLL), for generating a radio frequency clock signal for usage in the mixer 104 and a transmit phase locked loop 107 (TxPLL) for generating a radio frequency clock signal for usage in the mixer 105 and a PLL 119 for generating a sampling clock signal for converters RxADC 111 and TxDAC 112. The RF part 118 further comprises low-pass filters 108 for filtering the down-converted receive signal, the analog-to-digital converter 111 (RxADC) for converting the filtered down-converted receive signal to a digital receive signal, the digital-to-analog converter 112 (TxDAC) for converting a digital baseband signal to an analog baseband signal and low-pass filter 109 for filtering the analog baseband signals. A reference clock 110 for generating a reference clock signal is distributed to said RxPLL 106, TxPLL 107, RxADC 111, TxDAC 112, and PLL 119 in said RF part 118. The reference clock 110 does not necessary need to be implemented in the RF part 118 as illustrated in the transceiver architecture 100 in FIG. 1. The reference clock 110 could for instance be implemented as a separate part, and thus the reference clock signal generated by the reference clock 100 would in that case just be distributed as an in-signal to the different parts 113,117,118 of the architecture 100.

The baseband part 113 comprises baseband receive circuits 114 (Rx) for processing said digital receive signal inputted from the RxADC 111 of the RF part 118, a baseband timing generator 115 for generating timing signals to all baseband signal processing circuits based on said reference clock signal 110 inputted to the baseband 113, and baseband transmit circuits 116 (Tx) for generating a digital transmit signal that is outputted to the TxDAC 112 in the RF part 118.

The other systems part 117 may comprise different types of circuits performing specific functions present in a wireless communication device (excluding the circuits belonging to the transceiver). Examples of such circuits may for instance be a GPS circuit, Bluetooth circuit, FM/AM radio circuit, etc. The circuits in the other systems part 117 need to be clocked by a reference clock to function in an optimal way. However, in many cases these circuits, due to cost aspects, design limitations, etc., are not clocked by own reference clocks, but are instead clocked by the same reference clock as the transceiver. Therefore, in the transceiver architecture 100 the reference clock signal 110 is outputted from the RF part 118 to the circuits in the other systems part 117.

The details regarding the functionality of the building blocks in the transceiver architecture 100 will not be discussed in closer detail since it is considered to be well-known to a person skilled in the art, and not deemed necessary for the understanding of the concept of the present invention and the embodiments thereof.

Many of the functions in modern day wireless communication devices rely on a reference clock operating at a stable reference frequency to function correctly. The accuracy of the reference clock is very important since any frequency variations or frequency drift may disrupt or severely degrade the performance of the communication device. The reference clock 100 in the transceiver architecture 100 in FIG. 1 is often implemented using a crystal oscillator. However, a crystal oscillator unfortunately suffers from limiting factors such as temperature dependencies, supply voltage variations, and aging effects, which all may cause frequency variations and or frequency drift. Frequency variation and drift may also occur during operation due to the movement of the mobile terminal. The movement may cause a change in the frequency of the received signal and thus a frequency difference between it and the reference clock will occur that must be compensated for by adjusting the reference clock in the mobile terminal.

Certain parts of the transceiver architecture 100 are more sensitive to frequency variations than other parts. Examples of parts or circuits that are more sensitive are the RxPLL 106 and TxPLL 105 generating radio frequency clock signals where the frequency accuracy constraints are very hard, the converters RxADC 111 and TxDAC 112 where the sample frequency needs to be close to the ideal sample frequency to not degrade the performance of the transceiver, and the baseband signal processing circuits that needs to have a stable baseband timing signal to start/stop the radio and the data processing performed by the baseband signal processing circuits with high accuracy in relation to the structure set by the system. Thus, some kind of frequency correction must be applied to the reference clock to safeguard the operation and performance of the wireless communication device.

To achieve a more stable and accurate reference frequency a frequency control (FC) mechanism, such as an automatic frequency control circuit (AFC), may be applied. The FC estimates a frequency error in the receive signal in relation to the reference frequency signal from the free-running reference clock and, if necessary, applies a correction to the free-running reference clock in order to synchronize or tune the frequency of the free-running reference clock to the counterpart transmitting the receive signal. In this way any frequency variations and frequency drift may be kept to a minimum.

Figure 2:
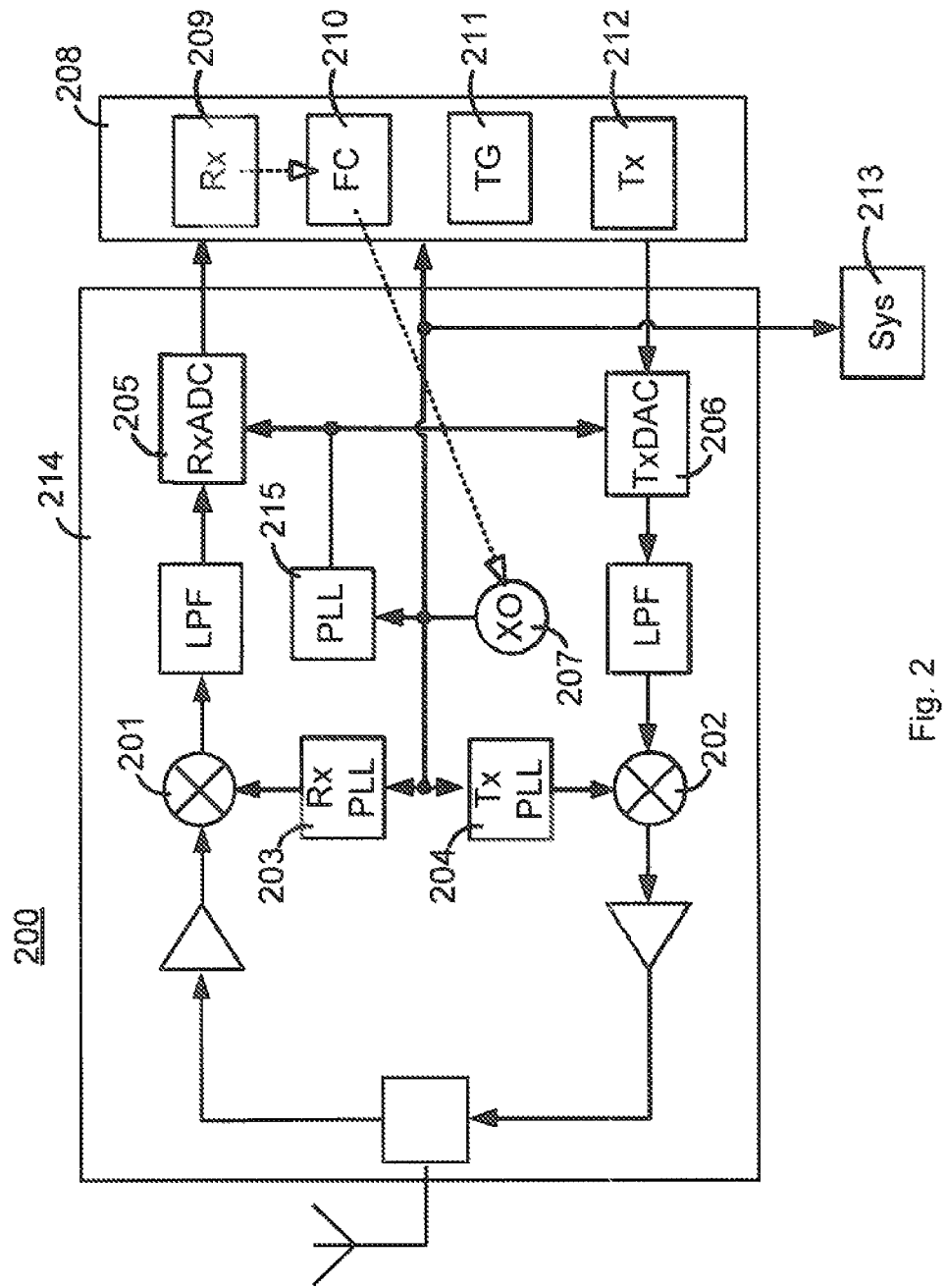
FIG. 2 shows a block diagram of a transceiver architecture using a frequency corrected reference clock for clocking the transceiver, according to prior art.

FIG. 2 shows a transceiver architecture 200, according to prior art, where frequency correction (FC) has been employed. The FC circuit 210 in the baseband 208 estimates a frequency error based on the free-running reference clock signal and the receive signal in Rx 209. The FC 210 generates a frequency correction value that corresponds to the estimated frequency error and applies the correction to the reference clock 207 as illustrated by the dashed arrow between FC 210 and the reference clock 207). In this way a frequency corrected reference clock signal will be distributed to all parts (BB 208 and Sys 213) and circuits (RxPLL 203, TxPLL 204 and PLL 215) that are sensitive to frequency variations, and thus eliminate any drift of the reference clock signal in relation to the receive signal.

However, a drawback with the transceiver architecture 200 in FIG. 2 is that sharing an FC corrected reference clock may cause problems for some functions in the wireless communication device. The frequency changes that occur when an FC correction is applied to the reference clock 207 will be passed on to all circuits in the wireless communication device that are connected to the reference clock signal. These changes, even if they are relatively small, may disrupt or degrade the performance of some of the functions that require a continuous and frequency stable reference clock.

Figure 3:
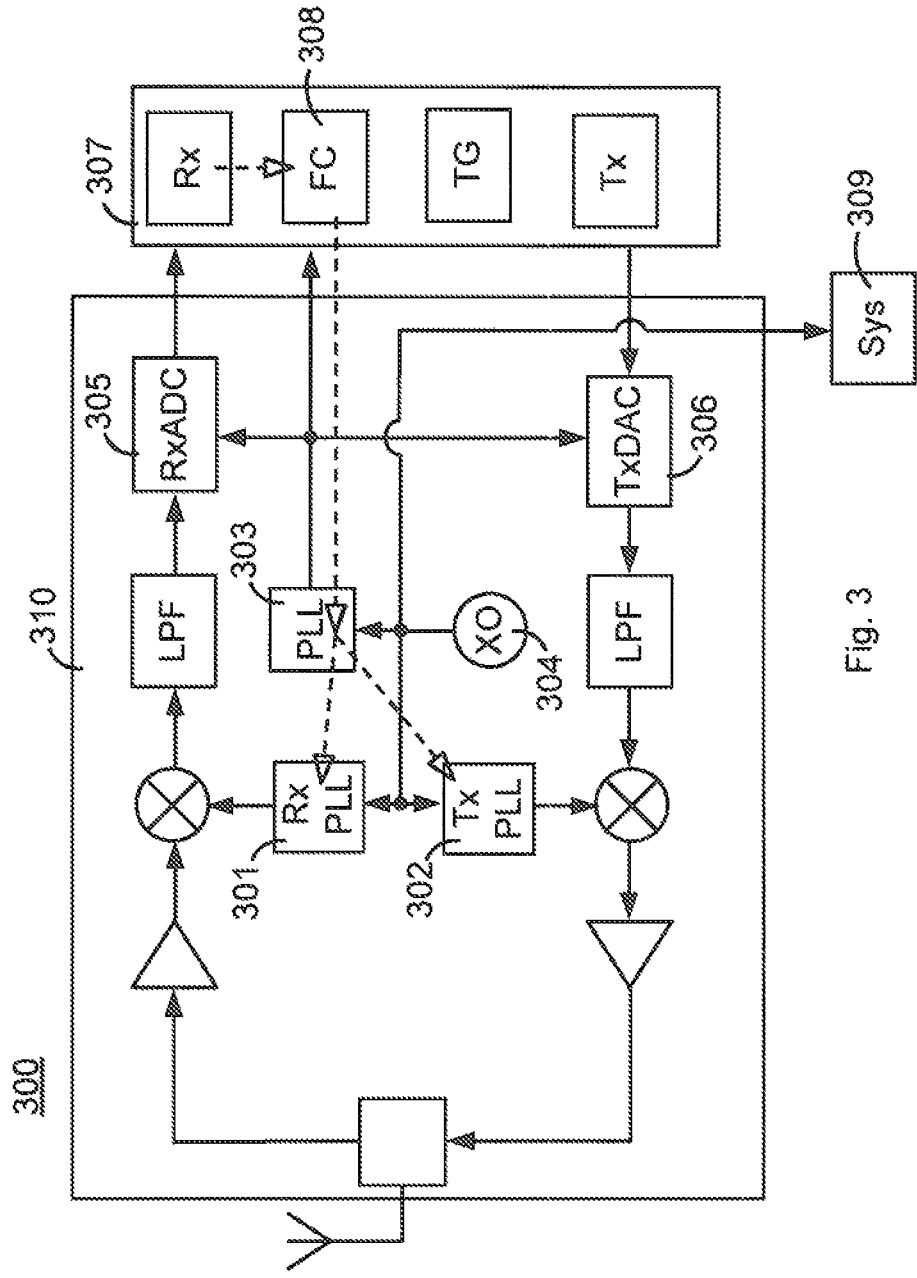
FIG. 3 shows a block diagram of a transceiver architecture using a free-running reference clock and frequency corrected phase locked loops for clocking the transceiver, according to prior art.

One way of reducing or eliminating this drawback is shown in the prior art transceiver architecture 300 in FIG. 3. In this transceiver architecture 300 an additional phase locked loop has been used in the RF part 310 to clock the converters 305,306 and the digital baseband 307. A free-running reference clock provides an uncorrected reference frequency clock signal to the RxPLL 301, TxPLL 302, PLL 303 and the circuits in the system 309. Instead of applying the frequency correction value, generated from the FC 308, directly on the free-running reference clock 304 the frequency correction value is applied directly to the PLLs 301,302,303 clocking time critical functions in the transceiver architecture 300. In this way the frequency changes arising from the applying of the frequency correction values to the PLLs do not propagate to the circuits in the system part 309, and thus will not disrupt or degrade the performance of the functions that require a continuous and frequency stable reference clock.

However, a drawback with the transceiver architecture in FIG. 3 is that the PLL 303 responsible for providing a corrected reference clock signal to the digital baseband 307 must be started to generate the corrected reference clock signal to the baseband 307. Starting the PLL 303 will both increase the power consumption and take time, which is not optimal. Another drawback is that two reference clocks, that will be very close in frequency, are distributed in the mobile terminal at the same time, and in worst case the clock signals could interact with each other creating beat notes, spurious sidebands, etc. that will degrade the performance of the mobile terminal. The present invention disclosed in FIG. 4 mitigates and or alleviates the drawbacks of previous prior art examples in FIG. 1-3.

Figure 4:
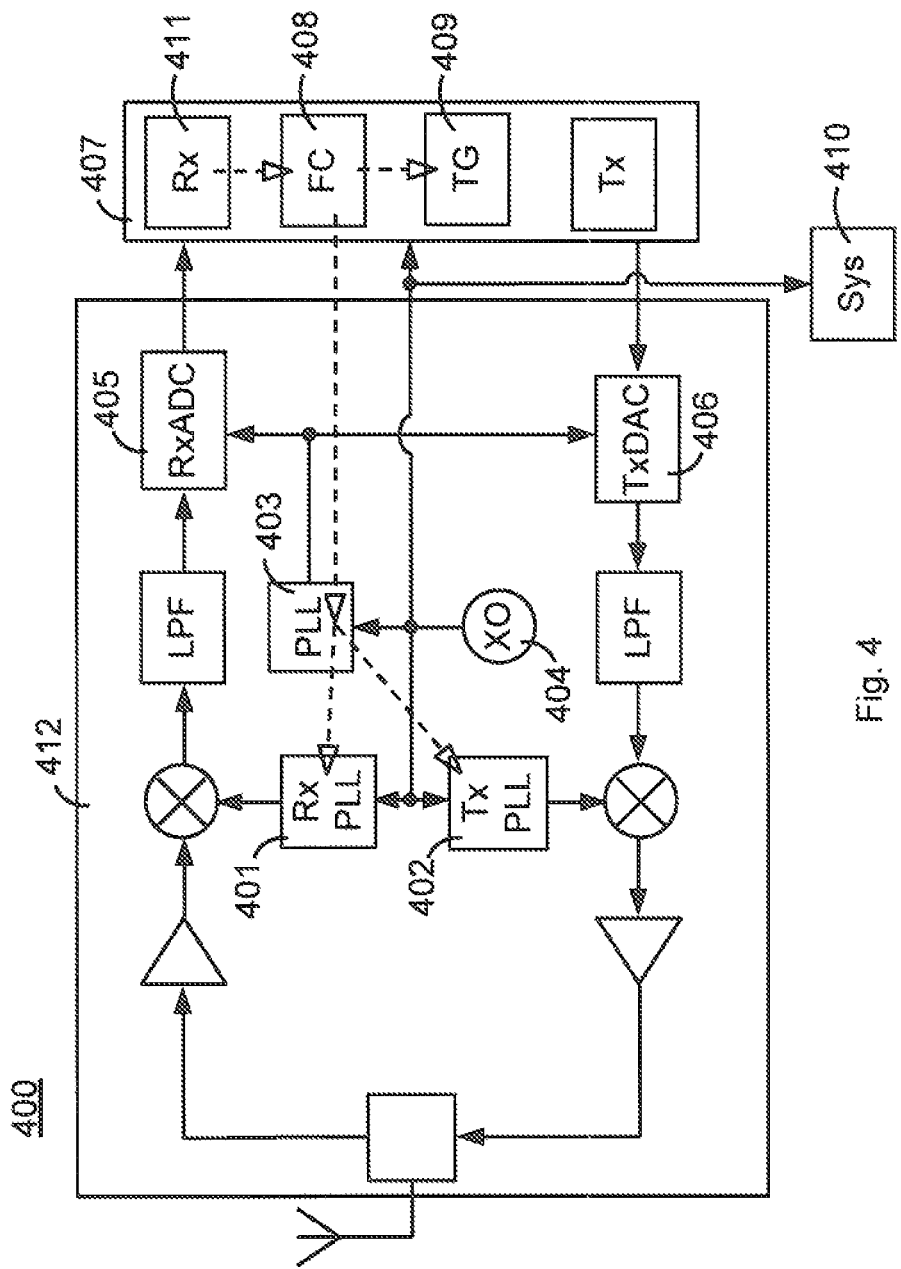
FIG. 4 shows a block diagram of a transceiver architecture using a free-running reference clock and frequency corrected phase locked loops for clocking the transceiver, and a frequency corrected timing generator for generating a timing signal to the baseband signal processing, according to an embodiment of the present invention.

FIG. 4 shows a transceiver architecture according to an embodiment of the present invention in which a free-running reference clock 404 generates an uncorrected reference clock signal that is distributed to the PLLs 401,102,403, the system circuits 410 and to the baseband 407. A frequency correction value generated by the FC 408 is applied directly onto the PLLs 401,402,403 to safeguard the accuracy of the radio frequency clock signals generated by the PLLs. To avoid having to start the PLL 403 each time any of the baseband signal processing circuits needs to perform a function, which was the case in the transceiver architecture 300 in FIG. 3, the baseband 407 is in this architecture clocked by an uncorrected reference clock signal coming from the free-running reference clock 404. However, providing the baseband 407 with an uncorrected reference clock signal is not optimal since the baseband signal processing circuits needs to have a stable and accurate clock signal to be able to provide an accurate timing signal for the circuits. To be able to fulfill this requirement a frequency correction value is separately, locally in the baseband 407, applied to the timing generator 409 provided with the uncorrected reference clock signal. In this way an accurate timing generator signal may be guaranteed to the baseband signal processing circuits, independently from the PLL 403. The invention allows for a new clocking methodology where a free-running reference clock signal is distributed to all parts and circuits of the wireless communication device, and where frequency correction only is applied locally to the circuits that need to produce a clocking signal with a high accuracy.

Figure 5:
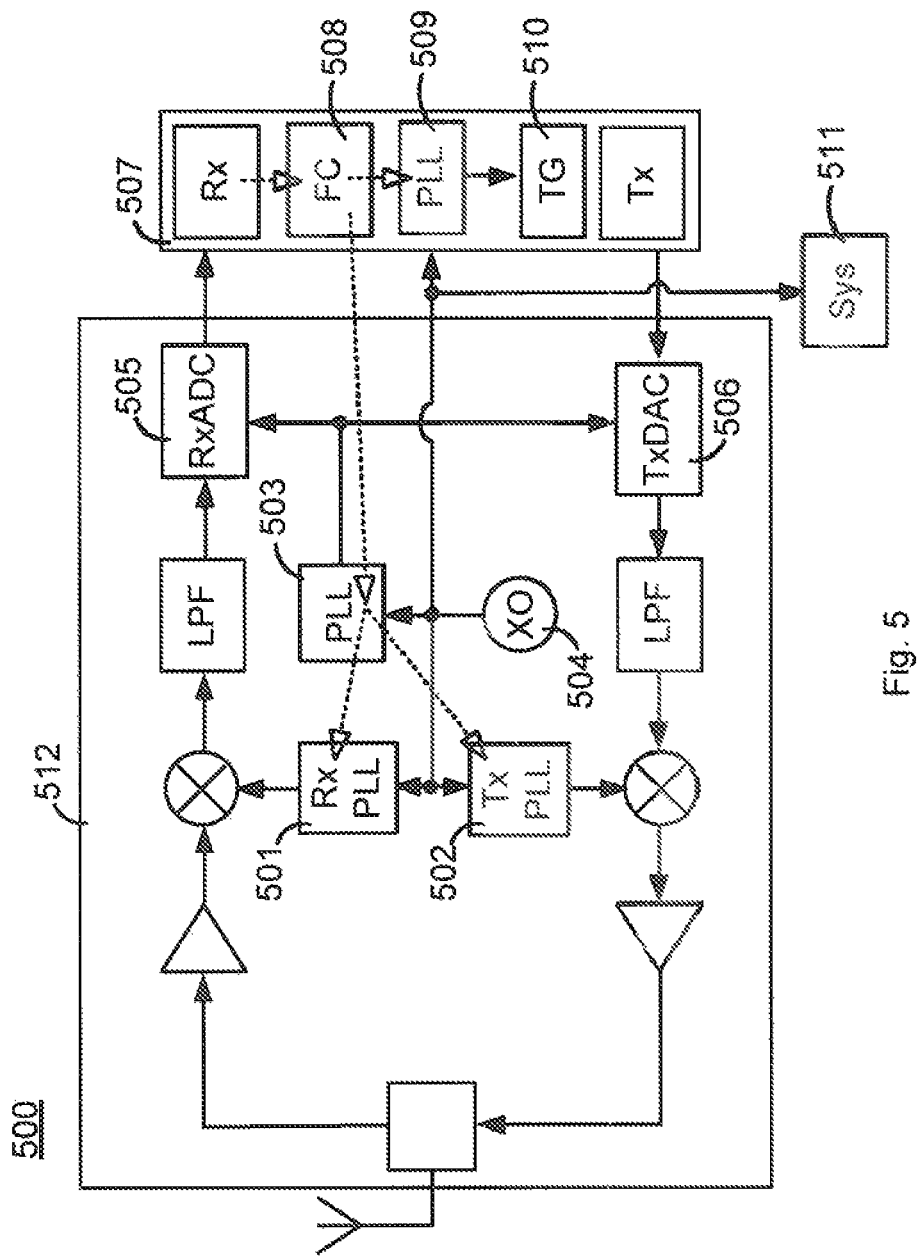
FIG. 5 shows a block diagram of a transceiver architecture using a free-running reference clock and frequency corrected phase locked loops for clocking the transceiver, and a frequency corrected phase locked loop to clock the timing generator in the baseband, according to a variant of the embodiment of the present invention in FIG. 4.

FIG. 5 shows a variant of the embodiment of the present invention shown in FIG. 4. In the transceiver architecture 500 shown in FIG. 5 a PLL 509 in the baseband 507 is utilized to provide a clocking signal to the TG 510. In this embodiment the uncorrected reference clock signal will be provided to the PLL 509, instead of directly to the timing generator circuit 510 as in the transceiver architecture in FIG. 4, and the frequency correction value from the FC 508 will be directly applied to the PLL 509. In this way the PLL 509 will generate a stable and corrected clock signal which is provided to the timing generator circuit 510 so that the timing generator circuit can generate an accurate baseband timing signal to the baseband signal processing circuits.

Figure 6:
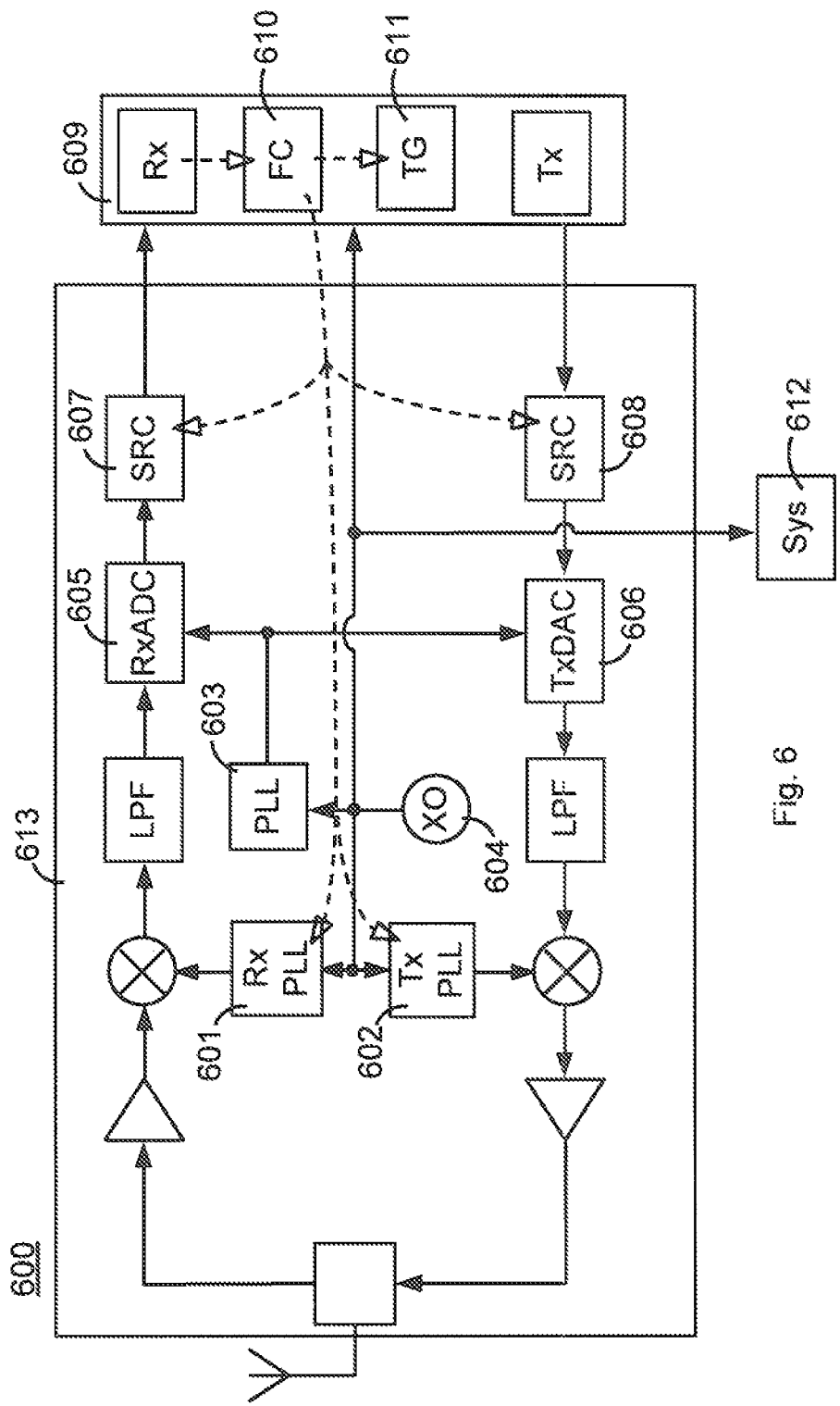
FIG. 6 shows a block diagram of a transceiver architecture using a free-running reference clock and frequency corrected phase locked loops for clocking the transceiver, wherein frequency correction is applied to sample rate converters as well as to a timing generator in the baseband, according to a variant of the embodiment of the present invention in FIG. 4.

FIG. 6 shows yet another variant of the embodiment of the present invention shown in FIG. 4. In the transceiver architecture 600 shown in FIG. 6 sample rate converters 607,608 have been inserted, into the RF part 613 between the converters 605,606 and the baseband 609. A free-running reference clock 604 generates an uncorrected reference clock signal that is distributed to the PLLs 601,602,603, the circuits in the other systems part 612 and to the baseband 609. A frequency correction value generated by the FC 610 in the baseband 609 is applied directly to the RxPLL 601 and TxPLL 602. To ensure the accuracy of the time critical sample rate converters 607,608 a frequency correction value generated by the FC 610 is applied to the SRCs. As in the case with the architecture in FIG. 4 the baseband 407 is clocked by the uncorrected reference clock signal coming from the free-running reference clock 404. To ensure the generation of a stable baseband timing signal, independently from other clock signals, a frequency correction value is locally applied to the timing generator 611 in the baseband 609.

Figure 7:
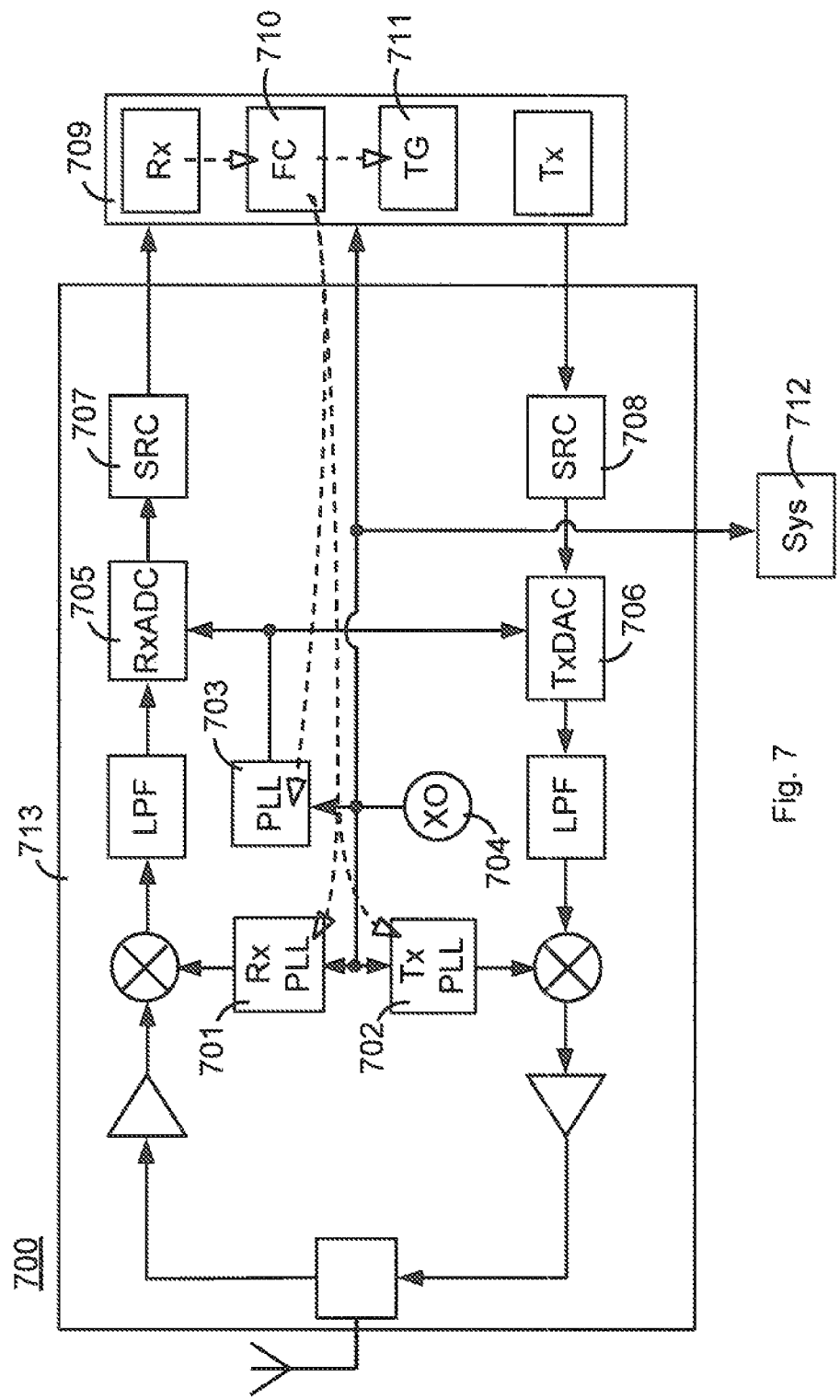
FIG. 7 shows a block diagram of a transceiver architecture using a free-running reference clock and frequency corrected phase locked loops for clocking the transceiver and a timing generator in the baseband, according to a variant of the embodiment in FIG. 4.

FIG. 7 shows yet another variant of the embodiment of the present invention similar to the one shown in FIG. 6. In the transceiver architecture 700 shown in FIG. 7 a free-running reference clock 704 generates an uncorrected reference clock signal that is distributed to the PLLs 701,702,703, the circuits in the other systems part 712 and to the baseband 709. A frequency correction value generated by the FC 710 in the baseband 709 is in this case applied directly to the RxPLL 701, TxPLL 702, PLL 703 and to the TG 711 in the baseband. By applying a frequency correction on the PLL 703 for the converters RxADC 705, TxDAC 706 and the baseband 709 the accuracy of the sample rate converters 707,708 can also be ensured if the SRCs 707,708 are triggered by the incoming data to the SRCs instead of a reference clock signal. In this way all frequency sensitive parts in the tranceiver are supplied with corrected frequencies and stability is thus ensured.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

The foregoing has described the principles, preferred embodiments and modes of operation of the present invention. However, the invention should be regarded as illustrative rather than restrictive, and not as being limited to the particular embodiments discussed above. The different features of the various embodiments of the invention can be combined in other combinations than those explicitly described. It should therefore be appreciated that variations may be made in those embodiments by those skilled in the art without departing from the scope of the present invention as defined by the following claims.

The invention claimed is:

1. A method for generating clock signals in a wireless communication device including a transceiver, a baseband (BB) circuit and a system part, the method comprising:
   generating an uncorrected reference clock signal in the transceiver;
   providing the uncorrected reference clock signal to the BB circuit and to the system part;
   generating a frequency correction value corresponding to a frequency error in said uncorrected reference clock signal, in the BB circuit;
   providing the frequency correction value to the transceiver;
   generating a corrected reference signal in the transceiver, based on the uncorrected reference clock signal and the frequency correction value; and
   converting
   a radio frequency (RF) analog signal received in the transceiver into a receive BB digital signal provided to the BB circuit, using the corrected reference signal; and/or
   a transmit BB digital signal received by the transceiver from the BB circuit, into a transmit RF analog signal using the corrected reference signal.

2. A method according to claim 1, further comprising:
   generating a BB corrected reference signal in the BB circuit, based on the uncorrected reference clock signal and the frequency correction value.

3. The method according to claim 1, wherein the generating of the corrected reference signal in the transceiver comprises:
   generating a first corrected reference signal based on the uncorrected reference clock signal and the frequency correction value using a first PLL in the transceiver, wherein the first corrected reference signal is mixed with the receive RF analog signal to obtain a receive BB analog signal; and
   generating a second corrected reference signal based on the uncorrected reference clock signal and the frequency correction value using a second PLL in the transceiver, wherein the second corrected reference signal is mixed with a transmit BB analog signal obtained from the transmit BB digital signal.

4. The method according to claim 3, further comprising:
   generating a third corrected reference signal based on the uncorrected reference clock signal and the frequency correction value using a third PLL in the transceiver, wherein the third corrected reference signal is used for converting the receive BB analog signal into the receive BB digital signal, and/or for converting the transmit BB analog signal into the transmit BB digital signal.

5. A wireless communication device comprising:
a transceiver including a free-running reference clock circuit configured to generate an uncorrected reference clock signal;
a frequency control circuit configured to generate a frequency correction value computed to compensate a frequency error in said uncorrected reference clock signal;
an analog radio frequency (RF) part; and
a baseband (BB) part comprising BB processing circuits, wherein
the uncorrected reference clock signal is distributed from said free-running reference clock circuit to the BB part and to the analog RF part,
the analog RF part comprises a set of phase-locked loops (PLLs) configured to generate local oscillator signals using the uncorrected reference clock signal and the frequency correction value, and
the BB part comprises a timing generator configured to generate a timing generator signal provided to the BB processing circuits, wherein the frequency correction value is applied locally in the BB part.

6. The wireless communication device according to claim 5, wherein the analog RF part comprises:
a first mixer configured to down-convert a received RF signal to a received BB signal, using a first local oscillator signal among the local oscillator signals;
a second mixer configured to up-convert a transmit BB signal to a transmit RF signal, using a second oscillator signal among the local oscillator signals;
a receive (Rx) analog-to-digital converter (ADC), an output of the first mixer being operatively connected to an input of the Rx ADC, the Rx ADC being configured to generate a digital receive signal and to provide the digital receive signal to the BB part; and
a transmit (Tx) digital-to-analog converter (DAC), an input of the second mixer being operatively connected to an output of the Tx DAC, the Tx DAC being configured to convert a transmit digital BB signal received from the BB part, to the transmit BB signal, and
wherein the set of PLLs in analog RF part comprises:
an RxPLL configured to generate the first local oscillator signal provided to the first mixer,
a TxPLL configured to generate the second local oscillator signal provided to the second mixer, and
a PLL configured to generate a sampling clock signal provided to the Rx ADC and to the Tx DAC, using the uncorrected reference clock signal and the frequency correction value.

7. The wireless communication device according to claim 6, wherein the analog RF part further comprises:
a first sample rate converter (SRC) between the Rx ADC and the BB part, and
a second SRC between the BB part and the TxADC.

8. The wireless communication device according to claim 7, wherein said frequency control circuit provides the frequency correction value to the first SRC and to the second SRC.

9. The wireless communication device according to claim 7, wherein the first SRC and the second SRC are triggered by receiving incoming digital signals.

10. The wireless communication device according to claim 5, wherein the frequency correction value is used by the timing generator in the BB part.

11. The wireless communication device according to claim 5, wherein the BB part comprises a BB PLL configured to provide a clocking signal to the timing generator in the BB part, the clocking signal being generated based on the uncorrected reference clock signal and the frequency correction value.

12. The wireless communication device according to claim 5, wherein the frequency control circuit is included in the BB part.

13. The wireless communication device according to claim 5, further comprising:
a system part configured to receive the uncorrected reference clock signal.

14. The wireless communication device according to claim 13, wherein said system part comprises a GPS circuit.

15. The wireless communication device according to claim 13, wherein said system part comprises a Bluetooth circuit.

16. The wireless communication device according to claim 13, wherein said system part comprises an FM/AM radio circuit.

* * * * *

UNITED STATES PATENT AND TRADEMARK OFFICE
CERTIFICATE OF CORRECTION

PATENT NO. : 9,048,978 B2
APPLICATION NO. : 13/809234
DATED : June 2, 2015
INVENTOR(S) : Isberg It is certified that error appears in the above-identified patent and that said Letters Patent is hereby corrected as shown below:

On the Title Page, in Item (73), under "Assignee", in Column 1, Line 2, delete "ERISSON" and insert -- ERICSSON --, therefor.

IN THE SPECIFICATION

In Column 4, Lines 49-50, delete "reference clock 100" and insert -- reference clock 110 --, therefor.

In Column 5, Lines 17-18, delete "reference clock 100" and insert -- reference clock 110 --, therefor.

Signed and Sealed this
Sixteenth Day of February, 2016

Michelle K. Lee
*Director of the United States Patent and Trademark Office*